(12) United States Patent
Kanazawa et al.

(10) Patent No.: US 12,528,663 B2
(45) Date of Patent: Jan. 20, 2026

(54) WORKPIECE PROCESSING APPARATUS

(71) Applicant: TOKYO SEIMITSU CO., LTD., Hachioji (JP)

(72) Inventors: Masaki Kanazawa, Hachioji (JP); Hitoshi Aoki, Hachioji (JP); Kiyotaka Kizaki, Hachioji (JP)

(73) Assignee: TOKYO SEIMITSU CO., LTD., Tokyo (JP)

( * ) Notice: Subject to any disclaimer, the term of this patent is extended or adjusted under 35 U.S.C. 154(b) by 57 days.

(21) Appl. No.: 18/699,579

(22) PCT Filed: Jun. 24, 2022

(86) PCT No.: PCT/JP2022/025282
§ 371 (c)(1),
(2) Date: Apr. 8, 2024

(87) PCT Pub. No.: WO2023/062884
PCT Pub. Date: Apr. 20, 2023

(65) Prior Publication Data
US 2024/0400339 A1    Dec. 5, 2024

(30) Foreign Application Priority Data

Oct. 14, 2021    (JP) .................................. 2021-169104

(51) Int. Cl.
*B65H 41/00*    (2006.01)
*B65H 29/56*    (2006.01)

(52) U.S. Cl.
CPC ............. *B65H 41/00* (2013.01); *B65H 29/56* (2013.01); *B65H 2701/37* (2013.01)

(58) Field of Classification Search
CPC .... B65H 2701/37; B65H 29/56; B65H 41/00; H01L 21/683
See application file for complete search history.

(56) References Cited

U.S. PATENT DOCUMENTS

| 2005/0205204 A1 | 9/2005 | Kurosawa et al. ........... 156/344 |
| 2009/0014124 A1 | 1/2009 | Tsujimoto et al. ........... 156/344 |

(Continued)

FOREIGN PATENT DOCUMENTS

| JP | H1116862 | 1/1999 |
| JP | 2005209942 | 8/2005 |

(Continued)

OTHER PUBLICATIONS

International Preliminary Report on Patentability, PCT/JP2022/025282, dated Dec. 6, 2023; 4 pages.

(Continued)

*Primary Examiner* — Sonya M Sengupta
(74) *Attorney, Agent, or Firm* — Fattibene and Fattibene LLC; Paul A. Fattibene

(57) ABSTRACT

A workpiece processing apparatus that prevents a processing capability of a processing apparatus from deteriorating due to a peeling unit that peels a protective sheet from a workpiece. A workpiece processing apparatus includes an affixing unit that affixes a dicing tape to a workpiece and a dicing frame, and a plurality of peeling units that peel a protective sheet previously affixed to the workpiece from the workpiece integrated with the dicing frame via the dicing tape.

4 Claims, 2 Drawing Sheets

(56) References Cited

U.S. PATENT DOCUMENTS

| | | | |
|---|---|---|---|
| 2009/0090451 A1 | 4/2009 | Yamamoto et al. | 156/64 |
| 2013/0208994 A1 | 8/2013 | Shirata | 382/254 |
| 2015/0343755 A1 | 12/2015 | Honda et al. | B32B 43/006 |
| 2024/0400339 A1* | 12/2024 | Kanazawa | H01L 21/683 |

FOREIGN PATENT DOCUMENTS

| | | |
|---|---|---|
| JP | 2009094132 | 4/2009 |
| JP | 2013164796 | 8/2013 |
| JP | 2014036143 | 2/2014 |
| JP | 2016008104 | 1/2016 |
| JP | 2017123409 | 7/2017 |
| JP | 2017220506 | 12/2017 |
| JP | 2020027810 | 2/2020 |
| JP | 2020116712 | 8/2020 |
| TW | 2008518215 | 6/2005 |
| TW | 201616609 | 5/2016 |
| TW | 201724338 | 7/2017 |

OTHER PUBLICATIONS

Office Action in counterpart Korean application No. 10-2024-7010775, Dispatch Date Feb. 28, 2025; with English translation; 7 pages.

International Search Report, PCT/JP2022/025282, dated Sep. 13, 2022, 2 pages.

English translation of Examination Notification dated Jun. 8, 2023 in counterpart Taiwan Application No. 111126283, 5 pages.

English translation of Examination Notification dated Dec. 29, 2023 in counterpart Taiwan Application No. 111126283, 3 pages.

* cited by examiner

WORKPIECE PROCESSING APPARATUS

TECHNICAL FIELD

The present invention relates to a workpiece processing apparatus.

BACKGROUND ART

In a semiconductor manufacturing field, there is a process for grinding and thinning a rear surface of a semiconductor substrate such as a silicon wafer (hereinafter referred to as a "workpiece"). In the process, a protective sheet composed of an adhesive film or the like is affixed to a front surface of the workpiece, to protect a device formed on the front surface of the workpiece.

Patent Literature 1 discloses a processing apparatus 60 that affixes a dicing tape 17 to an object to be processed 11 and an annular frame 15 and then peels a protective tape affixed to the object to be processed 11 using a tape peeling unit 74a. Reference signs are in Patent Literature 1.

CITATION LIST

Patent Literature

Patent Literature 1: Japanese Patent Laid-Open No. 2020-116712

SUMMARY OF INVENTION

Technical Problem

In recent years, a workpiece tends to be thinned. When a protective sheet needs to be deliberately peeled at low speed such that a workpiece having a low rigidity is not cracked when the protective sheet is peeled, whereby a processing capability of an entire processing apparatus may deteriorate. When a release tape is used to peel the protective sheet, switching or replacement of the release tape to be performed after a tape peeling unit is stopped may cause the processing capability of the entire processing apparatus to deteriorate.

Therefore, there occurs a technical problem to be solved to prevent the processing capability of the processing apparatus from deteriorating due to the peeling unit that peels the protective sheet, and the present invention has as its object to solve this problem.

Solution to Problem

To attain the above-described object, a workpiece processing apparatus according to the present invention is a workpiece processing apparatus, which includes an affixing unit that affixes a dicing tape to a workpiece and a dicing frame, and a plurality of peeling units that peel a protective sheet previously affixed to the workpiece from the workpiece integrated with the dicing frame via the dicing tape, each of the peeling units includes a bonding section that bonds a release tape to the protective sheet and a peeling table that is movable relative to the bonding section with the workpiece placed thereon, each of the peeling units is configured to be able to adjust a temperature of the bonding section and the peeling table to be a temperature suitable for processing of a workpiece to be then processed at a standby time, and the type of the release tape differs between the peeling units depending on the type of the workpiece.

According to this configuration, the plurality of peeling units peel the protective sheet affixed to the workpiece. Accordingly, even when the protective sheet must be deliberately peeled at low speed from a thin workpiece, a processing capability of the workpiece processing apparatus can be prevented from deteriorating. Further, in parallel with the peeling of the protective sheet by any one of the peeling units, maintenance and switching or replacement of a release tape can be performed in the other peeling unit, whereby the processing capability of the workpiece processing apparatus can be prevented from deteriorating.

Advantageous Effect of Invention

In the present invention, a processing capability of a workpiece processing apparatus can be prevented from deteriorating due to a peeling unit.

DESCRIPTION OF EMBODIMENT

Figure 1:
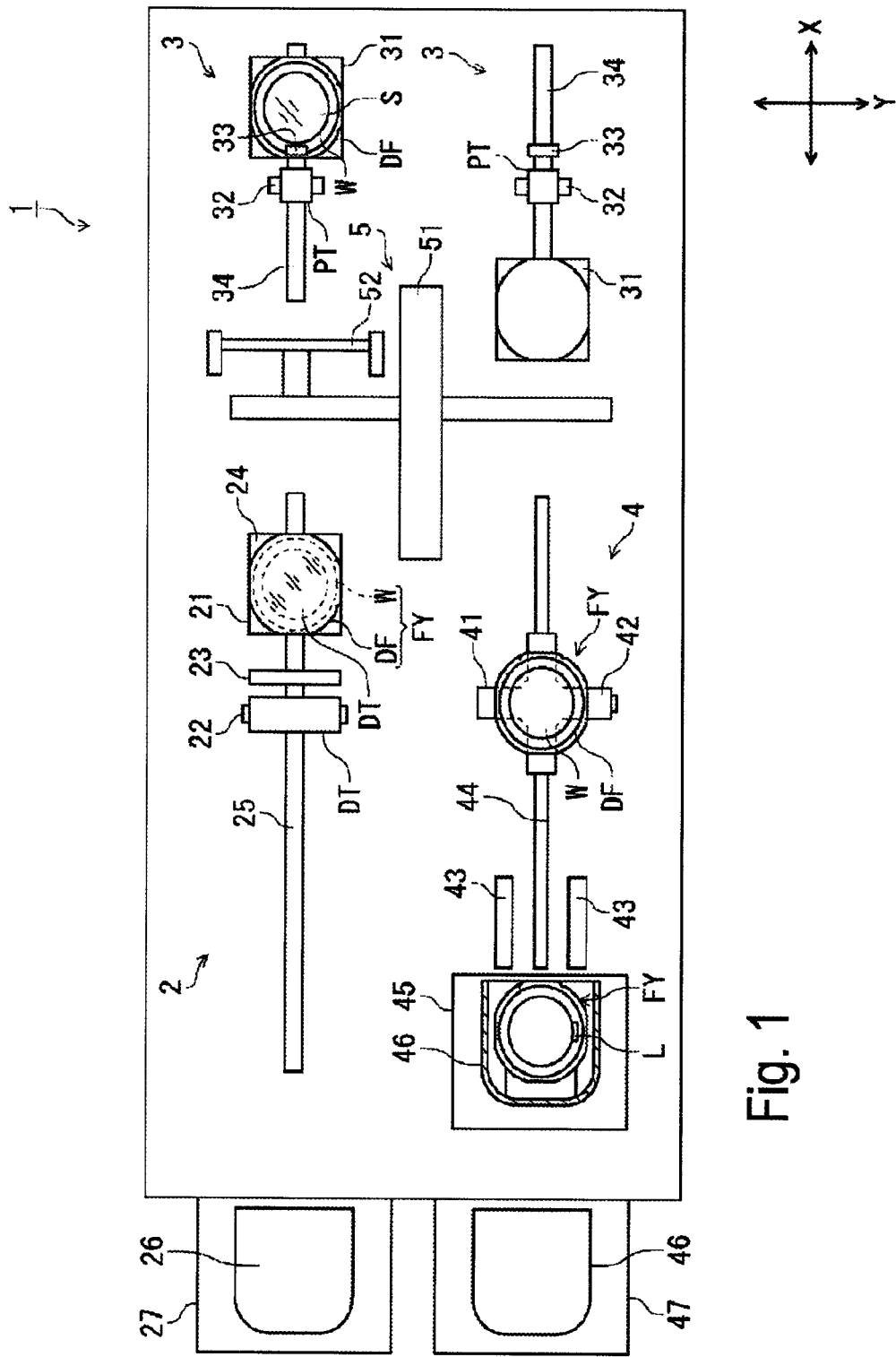
FIG. 1 is a plan view illustrating a workpiece processing apparatus according to an embodiment of the present invention.

An embodiment of the present invention will be described with reference to the drawings. Hereinafter, when reference is made to the number of components or a numerical value, amount, range, or the like of each of the components, the number or the like is not limited to a particular number but may be the particular number or more or the particular number or less unless otherwise stated or except when expressly limited to the particular number in principle.

When reference is made to a shape of each of components and a positional relationship among the components, a substantially approximate or similar shape or the like is included unless otherwise stated or except when considered to be expressly excluded in principle.

In the drawings, there is a case where some of components are omitted and characteristic portions are exaggerated by being enlarged, for example, in order to facilitate the understanding of features, and a dimension ratio or the like of each of the components is not necessarily the same as an actual one. In a cross-sectional view, hatching of some of the components may be omitted in order to facilitate the understanding of a cross-sectional structure of the components. In the present embodiment, terms representing directions such as up-down and left-right directions are not absolute, but are appropriate if each of the components is in an orientation depicted in the drawings. However, if the orientation has changed, the terms should be construed by being changed depending on the change in the orientation.

Figure 2:
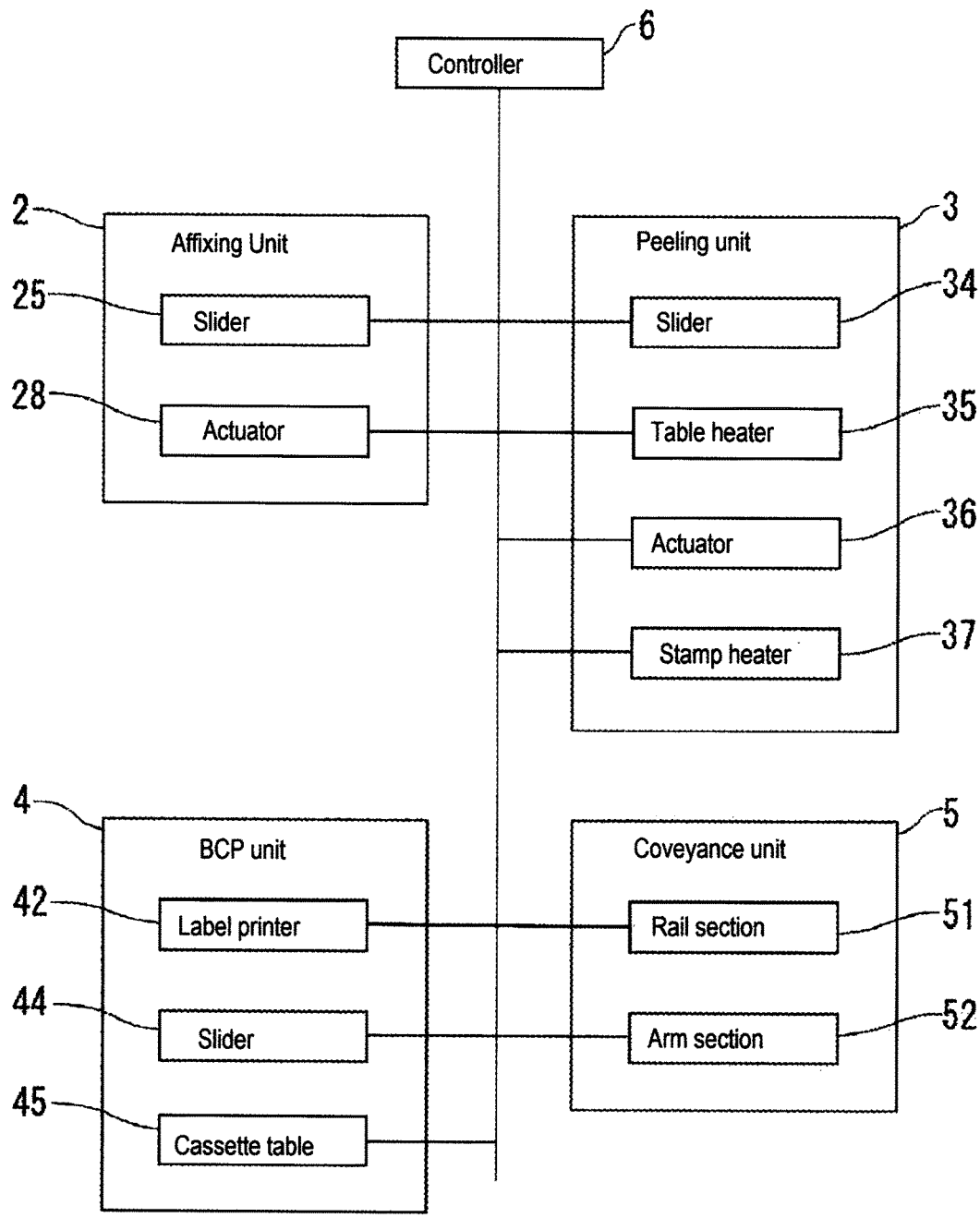
FIG. 2 is a block diagram illustrating a partial configuration of the workpiece processing apparatus.

FIG. 1 is a plan view illustrating a workpiece processing apparatus 1. FIG. 2 is a block diagram illustrating a partial configuration of the workpiece processing apparatus 1. The workpiece processing apparatus 1 includes an affixing unit 2, a peeling unit 3, a BCP unit 4, and a conveyance unit 5.

The affixing unit 2 includes an affixing table 21, a feed roller 22, and a pressing roller 23. The affixing unit 2 affixes a dicing tape DT to a workpiece W and a dicing frame DF. The workpiece W is a semiconductor substrate such as a silicon wafer, for example, but is not limited to this. The dicing tape DT is an ultraviolet curable tape or the like.

Hereinafter, the workpiece W and the dicing frame DF that are integrated via the dicing tape DT are referred to as a "frame unit FY".

The affixing table 21 includes an inner periphery-side table not illustrated that suction-holds the workpiece W and an outer periphery-side table 24 that is provided on an outer periphery of the inner periphery-side table and on which the dicing frame DF is placed.

A suction member composed of a porous material not illustrated is provided on a surface of the inner periphery-side table. The suction member is connected to a vacuum source or a compressed air source not illustrated. When the vacuum source is started, a negative pressure is supplied between the workpiece W placed on the suction member and the suction member so that the workpiece W is suction-held in the suction member. When the compressed air source is started, compressed air (release air) is supplied between the workpiece W and the suction member so that the suction between the workpiece W and the suction member is released.

The affixing table 21 is placed on a slider 25, and is configured to be slidable between a standby position as one end in an X-direction (in a left-right direction on the paper plane of FIG. 1) and a delivery position as the other end in the X-direction. When the affixing table 21 is positioned at the delivery position, a conveyance arm not illustrated places the workpiece W that has passed through a previous process of a grinding apparatus or the like on the inner periphery-side table. Similarly, when the affixing table 21 is positioned at the standby position, the conveyance arm not illustrated takes out the dicing frame DF accommodated in each slot in the frame stocker 26 and places the dicing frame DF on the outer periphery-side table 24. The frame stocker 26 is accommodated in a frame stocker accommodation section 27 that can be accessed from outside.

The feed roller 22 feedably supports the dicing tape DT, and exerts a tension to the dicing tape DT and regulates a trajectory of the dicing tape DT in cooperation with a winding roller, a guide roller, and a knife plate not illustrated.

The pressing roller 23 is configured to be movable up and down by an actuator 28. The pressing roller 23 affixes the dicing tape DT to the workpiece W and the dicing frame DF by pressing.

The conveyance unit 5 conveys the frame unit FY among the affixing unit 2, the peeling unit 3, and the BCP unit 4. The conveyance unit 5 includes a rail section 51 and an arm section 52 that is supported on the rail section 51 to be movable in the X-direction and a Y-direction (in an up-down direction on the paper plane of FIG. 1) perpendicular to the X-direction.

In the affixing unit 2, the dicing tape DT is affixed in the following procedure. That is, when the affixing table 21 slides to the standby position, the workpiece W is placed on and suction-held in the inner periphery-side table, and the dicing frame DF is transferred to the outer periphery-side table 24 from the frame stocker 26.

Then, the affixing table 21 is moved toward the other end in the X-direction such that an outer peripheral portion of the dicing frame DF is arranged below the pressing roller 23. Then, the actuator 28 fully extends to lower the pressing roller 23, and the pressing roller 23 affixes the dicing tape DT to the dicing frame DF by pressing.

Then, when the affixing table 21 further moves toward the other end in the X-direction, the pressing roller 23 is gradually affixed to the dicing tape DT and the workpiece W in such a manner that the pressing roller 23 rolls on the dicing frame DF and the workpiece W.

When the workpiece W is integrated with the dicing frame DF via the dicing tape DT, the actuator 28 fully contracts to retract the pressing roller 23, and then moves the affixing table 21 to the delivery position.

The peeling unit 3 peels a protective sheet S (a BG tape) affixed to protect a front surface of the workpiece W in grinding a rear surface of the workpiece W. Although the workpiece processing apparatus 1 includes two peeling units 3 arranged side by side in the Y-direction, the number of peeling units 3 to be installed may be three or more. Release tapes PT respectively used to peel the protective sheet S by the peeling units 3 may be of different types or of the same type between the peeling units 3.

Each of the peeling units 3 includes a peeling table 31, a feed roller 32, and a heat stamp 33 as a bonding section.

The frame unit FY is placed on the peeling table 31 with the front surface of the workpiece W directed upward. A suction member composed of a porous material not illustrated is provided on a surface of the peeling table 31. The suction member is connected to a vacuum source or a compressed air source not illustrated. When the vacuum source is started, a negative pressure is supplied between the workpiece W placed on the suction member and the suction member so that the workpiece W is suction-held in the suction member. When the compressed air source is started, compressed air (release air) is supplied between the workpiece W and the suction member so that the suction between the workpiece W and the suction member is released.

The peeling table 31 is placed on a slider 34, and is configured to be slidable in the X-direction. A movement speed of the peeling table 31 is optionally changeable. For example, the protective sheet S is preferably peeled at low speed without damaging a thin workpiece W. A temperature of the peeling table 31 can be raised by a table heater 35. The temperature of the peeling table 31 is set to a temperature suitable for peeling the protective sheet S depending on a thickness, a material, and the like of the workpiece W.

The feed roller 32 feedably supports a strip-shaped release tape PT, and exerts a tension on the release tape PT and regulates a trajectory of the release tape PT in cooperation with a winding roller, a guide roller, and a knife edge not illustrated.

The heat stamp 33 is configured to be movable up and down by an actuator 36. A temperature of the heat stamp 33 can be raised by a stamp heater 37. A stamp temperature of the heat stamp 33 is set to a temperature suitable for peeling the protective sheet S depending on a thickness, a material, and the like of the workpiece W.

In the peeling unit 3, the protective sheet S is peeled in the following procedure. That is, when the peeling table 31 is first positioned at the standby position as the one end in the X-direction, the arm section 52 takes out the frame unit FY from the affixing table 21 positioned at the delivery position, turns the frame unit FY upside down, and then places the frame unit FY on the peeling table 31. Note that the frame unit FY is preferably placed on the peeling table 31 after the temperature of the peeling table 31 is previously raised to a predetermined temperature.

Then, the peeling table 31 is moved such that an outer peripheral portion of the workpiece W is arranged below the heat stamp 33 after the frame unit FY is sucked to the peeling table 31.

Then, the actuator 36 fully extends to lower the heat stamp 33, and the heat stamp 33 the temperature of which has been raised to a predetermined temperature by the stamp heater 37 is heated and pressed by contacting the release tape PT, whereby the release tape PT and the protective sheet S are welded to each other.

Then, the actuator 36 fully contracts to retract the heat stamp 33, and the peeling table 31 is then moved to the standby position. As the peeling table 31 moves, the protective sheet S is peeled from the workpiece W.

When the two peeling units 3 can be controlled to individually start and stop, and the type of the release tape PT is the same between the peeling units 3, respective protective sheets S on the two workpieces W can be peeled in parallel by the two peeling units 3. In parallel with the peeling of the protective sheets S by one of the peeling unit 3, maintenance and switching or replacement of the release tape PT can be performed in the other peeling unit 3.

If the type of the release tape PT differs between the peeling units 3, different types of workpieces W can be seamlessly processed. In this case, in parallel with the peeling of the protective sheet S by one of the peeling units 3, the respective temperatures of the peeling table 31 and the heat stamp 33 are preferably previously adjusted by starting the table heater 35 or the stamp heater 37 in the other peeling unit 3 to match a temperature of the peeling table 31 and a temperature of the heat stamp 33, which are suitable for peeling the protective sheet S, to be set depending on a thickness, a material, and the like of a workpiece W to be next processed.

The BCP unit 4 includes a BCP table 41, a label printer 42, and an unload section 43.

The frame unit FY is placed on the BCP table 41 with the front surface of the workpiece W directed upward. The BCP table 41 is placed on a slider 44, and is configured to be slidable between the standby position as the one end in the X-direction and the delivery position as the other end in the X-direction.

The label printer 42 affixes a label L on which an ID of the workpiece W is printed to the dicing tape DT or the dicing frame DF in the frame unit FY. The ID of the workpiece W is printed on the workpiece W, and is previously read by a reader not illustrated before the label L is affixed.

The unload section 43 receives the frame unit FY to which the label L is affixed from the BCP table 41, and accommodates the frame unit FY in a slot in a cassette table 45. The cassette table 45 is configured to be movable up and down with frame cassettes 46 respectively accommodated in two upper and lower stages.

The frame cassette 46 in an unaccommodated state where no frame unit FY is accommodated is pulled into the cassette table 45 by an arm or the like not illustrated after being accommodated in a frame cassette accommodation section 47. The frame cassette 46 in an accommodated state where a predetermined number of frame units FY are accommodated is discharged into the frame cassette accommodation section 47 by an arm or the like.

In the BCP unit 4, the label L is affixed in the following procedure. That is, when the BCP table 41 is positioned at the standby position, the arm section 52 takes out the frame unit FY from the peeling table 31 positioned at the standby position, and places the frame unit FY on the BCP table 41.

Then, the BCP table 41 is moved such that the dicing tape DT or the dicing frame DF is arranged below the label printer 42.

Then, the label printer 42 affixes the label L on which the ID of the workpiece W is printed to the dicing tape DT or the dicing frame DF.

When the BCP table 41 is moved to the delivery position after the label L is affixed, the unload section 43 takes out the frame unit FY from the BCP table 41. The cassette table 45 raises and lowers the frame cassette 46 such that a height of the unload section 43 and a position of a slot in the frame cassette 46 that accommodates the frame unit FY to be received match each other. The unload section 43 stores the frame unit FY in the slot in the frame cassette 46.

An operation of the workpiece processing apparatus 1 is controlled via a controller 6. The controller 6 controls each of components constituting the workpiece processing apparatus 1. The controller 6 is a computer, for example, and includes a CPU, a memory, and the like. A function of the controller 6 may be implemented by control using software, or may be implemented by operating using hardware.

Thus, the workpiece processing apparatus 1 according to the present embodiment is the workpiece processing apparatus 1, which is configured to include the affixing unit 2 that affixes the dicing tape DT to the workpiece W and the dicing frame DF and the plurality of peeling units 3 that peel the protective sheet S previously affixed to the workpiece W from the workpiece W integrated with the dicing frame DF via the dicing tape DT.

According to this configuration, the plurality of peeling units 3 peel the protective sheet S affixed to the workpiece W. Accordingly, even when the protective sheet S must be deliberately peeled at low speed from a thin workpiece W, a processing capability of the workpiece processing apparatus 1 can be prevented from deteriorating. Further, in parallel with the peeling of the protective sheet S by one of the peeling units 3, maintenance and switching or replacement of the release tape PT can be performed in the other peeling unit 3, whereby the processing capability of the workpiece processing apparatus 1 can be prevented from deteriorating.

The workpiece processing apparatus 1 according to the present embodiment is configured such that the peeling unit 3 includes the heat stamp 33 that bonds the release tape PT to the protective sheet S and the peeling table 31 that is movable relative to the heat stamp 33 with the workpiece W placed thereon and the type of the release tape PT differs between the peeling units 3 depending on the type of the workpiece W.

According to this configuration, the protective sheet S is peeled using the peeling unit 3 including the release tape PT suitable depending on the type of the workpiece W, thereby making it possible to also seamlessly process the different types of workpiece W.

The workpiece processing apparatus 1 according to the present embodiment is configured such that the temperature of the heat stamp 33 or the peeling table 31 can be adjusted to be a temperature suitable for processing of the workpiece W to be then processed.

According to this configuration, in parallel with the peeling of the protective sheet S by one of the peeling units 3, the respective temperatures of the peeling table 31 and the heat stamp 33 in the other peeling unit 3 are previously adjusted to match a temperature of the peeling table 31 and a temperature of the heat stamp 33, which are suitable for peeling a protective sheet S on a workpiece W to be next processed, thereby making it possible to seamlessly process the different types of workpieces W.

The workpiece processing apparatus 1 according to the present embodiment is configured such that the peeling unit 3 includes the heat stamp 33 that bonds the release tape PT to the protective sheet S and the peeling table 31 that is movable relative to the heat stamp 33 with the workpiece W placed thereon and the type of the release tape PT is the same between the peeling units 3.

According to this configuration, the two peeling units 3 can respectively peel the protective sheets S on the two workpieces W in parallel, whereby the processing capability of the workpiece processing apparatus 1 can be prevented from deteriorating.

In the present invention, it should be understood that various modifications can be made in addition to the foregoing without departing from the spirit of the prevent invention and the present invention covers the modifications.

REFERENCE SIGNS LIST

1: workpiece processing apparatus
2: affixing unit
21: affixing table
22: feed roller (in affixing unit)
23: pressing roller
24: outer periphery-side table
25: slider (for outer periphery-side table)
26: frame stocker
27: frame stocker accommodation section
28: actuator (for pressing roller)
3: peeling unit
31: peeling table
32: feed roller (in peeling unit)
33: heat stamp (bonding section)
34: slider (for peeling table)
35: table heater
36: actuator (for heat stamp)
37: stamp heater
4: BCP unit
41: BCP table
42: label printer
43: unload section
44: slider (for BCP table)
45: cassette table
46: frame cassette
47: frame cassette accommodation section
5: conveyance unit
51: rail section
52: arm section
6: controller
DE: dicing frame
DT: dicing tape
FY: frame unit
L: label
PT: release tape
S: protective sheet
W: workpiece

What is claimed is:

1. A workpiece processing apparatus comprising:
an affixing unit that affixes a dicing tape to a workpiece and a dicing frame;
a plurality of peeling units that peel a protective sheet previously affixed to the workpiece from the workpiece integrated with the dicing frame via the dicing tape,
each of the peeling units includes a bonding section that bonds a release tape to the protective sheet and a peeling table that is movable relative to the bonding section with the workpiece placed thereon,
each of the peeling units is configured to be able to adjust a temperature of the bonding section and the peeling table to be a temperature suitable for processing of a workpiece to be then processed at a standby time, and
the type of the release tape differs between the peeling units depending on the type of the workpiece.

2. A workpiece processing apparatus for processing a wafer comprising:
an affixing unit having a sliding affixing table configured to hold a frame unit including a dicing frame and the wafer having a protective sheet attached, said affixing unit configured to affix a dicing tape to the wafer and the dicing frame;
a first peeling unit having a first sliding peeling table configured to hold the frame unit, said first peeling unit having a first heat stamp configured to bond a first release tape to the protective sheet, and a first table heater configured to heat said first sliding peeling table to a first temperature suitable for peeling the protective sheet;
a second peeling unit having a second sliding peeling table configured to hold the frame unit, said second peeling unit having a second heat stamp configured to bond a second release tape to the protective sheet, and a second table heater configured to heat said second sliding peeling table to a second temperature suitable for peeling the protective sheet;
a BCP unit having a sliding BPC table; and
a conveyance unit positioned between said affixing unit, said first peeling unit, said second peeling unit, and said BPC unit, said conveyance unit configured to convey the frame unit selectively between said first peeling unit and said second peeling unit,
whereby conveying the frame unit selectively between said first peeling unit and said second peeling unit prevents a processing capability of the workpiece processing apparatus from deteriorating improving efficiency.

3. The workpiece processing apparatus for processing a wafer as recited in claim 2 wherein:
the first release tape is different than the second release tape.

4. The workpiece processing apparatus for processing a wafer as recited in claim 2 wherein:
the first temperature is different than the second temperature.

* * * * *